(12) United States Patent
Fisher et al.

(10) Patent No.: US 10,417,088 B2
(45) Date of Patent: Sep. 17, 2019

(54) DATA PROTECTION TECHNIQUES FOR A NON-VOLATILE MEMORY ARRAY

(71) Applicant: INTERNATIONAL BUSINESS MACHINES CORPORATION, Armonk, NY (US)

(72) Inventors: Timothy J. Fisher, Cypress, TX (US); Thomas Mittelholzer, Zurich (CH); Nikolaos Papandreou, Thalwil (CH); Thomas Parnell, Zurich (CH); Charalampos Pozidis, Thalwil (CH); Andrew D. Walls, San Jose, CA (US)

(*) Notice: Subject to any disclaimer, the term of this patent is extended or adjusted under 35 U.S.C. 154(b) by 119 days.

(21) Appl. No.: 15/807,719

(22) Filed: Nov. 9, 2017

(65) Prior Publication Data

US 2019/0138390 A1 May 9, 2019

(51) Int. Cl.
| | |
|---|---|
| G06F 11/10 | (2006.01) |
| H03M 13/29 | (2006.01) |
| G11C 29/52 | (2006.01) |
| H03M 13/15 | (2006.01) |
| H03M 13/00 | (2006.01) |

(Continued)

(52) U.S. Cl.
CPC .......... *G06F 11/1068* (2013.01); *G11C 29/52* (2013.01); *H03M 13/1515* (2013.01); *H03M 13/253* (2013.01); *H03M 13/29* (2013.01); *H03M 13/2906* (2013.01);
(Continued)

(58) Field of Classification Search
CPC ............... G06F 11/1068; G11C 29/52; H03M 13/2906; H03M 13/253; H03M 13/29; H03M 13/1515; H03M 13/2924; H03M 13/373; H03M 13/6516

USPC ....... 714/755, 763, 766, 768, 769, 770, 773, 714/784, 799

See application file for complete search history.

(56) References Cited

U.S. PATENT DOCUMENTS

| | | |
|---|---|---|
| 8,166,370 B1 | 4/2012 | Tang et al. |
| 8,869,006 B2 | 10/2014 | Blaum et al. |

(Continued)

OTHER PUBLICATIONS

Blaum, M., & Hetzler, S. R. (2016). Integrated Interleaved Codes as Locally Recoverable Codes: Properties and Performance. arXiv preprint arXiv:1602.02704.

(Continued)

*Primary Examiner* — John J Tabone, Jr.
(74) *Attorney, Agent, or Firm* — Michael R. Long; Wenjie Li

(57) ABSTRACT

A data protection technique combines error correcting code and redundant array of independent disk functionality for a non-volatile memory (NVM) array of a data storage system. The technique includes receiving, by a controller, data for storage in the NVM. In response to receiving the data for storage in the NVM array, the controller forms first component codewords based on encodings with a first level code of respective first portions of the data. In response to receiving the data for storage in the NVM array, the controller forms a second component codeword based on an encoding with a second level code of a second portion of the data and the first component codes. The controller stores a respective portion of each of the first and second component codewords on packages of the NVM array. The storing achieves maximum equal spreading of each of the component codewords across all of the packages.

20 Claims, 10 Drawing Sheets

(51) Int. Cl.
*H03M 13/25* (2006.01)
*H03M 13/37* (2006.01)

(52) U.S. Cl.
CPC ..... *H03M 13/2924* (2013.01); *H03M 13/373* (2013.01); *H03M 13/6516* (2013.01)

(56) References Cited

U.S. PATENT DOCUMENTS

| | | | |
|---|---|---|---|
| 8,887,020 B2 * | 11/2014 | Shokrollahi | H03M 13/3761 |
| | | | 714/752 |
| 8,910,012 B2 | 12/2014 | Blaum et al. | |
| 8,959,420 B1 | 2/2015 | Piszczek et al. | |
| 9,081,752 B2 | 7/2015 | Aliev et al. | |
| 9,219,503 B2 | 12/2015 | Li et al. | |
| 9,329,991 B2 | 5/2016 | Cohen et al. | |
| 9,417,960 B2 | 8/2016 | Cai et al. | |
| 9,798,622 B2 * | 10/2017 | Motwani | G06F 11/1076 |
| 10,268,538 B2 * | 4/2019 | Li | G06F 11/1008 |
| 2003/0058958 A1 * | 3/2003 | Shokrollahi | H03M 13/3761 |
| | | | 375/295 |
| 2007/0268834 A1 * | 11/2007 | Buckley | H03M 13/093 |
| | | | 370/242 |
| 2008/0069242 A1 * | 3/2008 | Xu | H04N 19/89 |
| | | | 375/240.24 |
| 2009/0222477 A1 * | 9/2009 | Kamra | G01V 1/003 |
| 2010/0146372 A1 * | 6/2010 | Tomlinson | H03M 13/2915 |
| | | | 714/780 |
| 2011/0246856 A1 * | 10/2011 | Jin | G11B 5/59655 |
| | | | 714/763 |
| 2013/0282953 A1 | 10/2013 | Orme et al. | |
| 2014/0068391 A1 * | 3/2014 | Goel | H03M 13/152 |
| | | | 714/785 |
| 2014/0380114 A1 * | 12/2014 | Alexeev | H03M 13/2906 |
| | | | 714/755 |
| 2016/0043742 A1 | 2/2016 | Cideciyan et al. | |
| 2016/0156372 A1 * | 6/2016 | Motwani | G06F 11/1076 |
| | | | 714/755 |
| 2016/0274970 A1 | 9/2016 | Earhart | |
| 2017/0201273 A1 * | 7/2017 | Bonke | G06F 11/1068 |
| 2017/0272209 A1 * | 9/2017 | Yanovsky | H04L 67/1097 |
| 2017/0277590 A1 * | 9/2017 | Luse | G06F 3/0617 |
| 2018/0032395 A1 * | 2/2018 | Yang | G06F 11/1068 |
| 2018/0067684 A1 * | 3/2018 | Benisty | G11C 29/52 |
| 2018/0069658 A1 * | 3/2018 | Benisty | H04L 1/0057 |
| 2018/0150351 A1 * | 5/2018 | Li | G06F 12/0806 |

OTHER PUBLICATIONS

Blaum, M., & Hetzler, S. (2014). Generalized concatenated types of codes for erasure correction. arXiv preprint arXiv:1406.6270.
Blank, J. S., Blaum, M., & Hafner, J. L. (2013). SD codes: erasure codes designed for how storage systems really fail. FAST, 95-104.
Sathiamoorthy, M., Asteris, M., Papailiopoulos, D. et al. (2013). Xoring elephants: Novel erasure codes for big data. In Proceedings of the VLDB Endowment, 6(5), 325-336.
Gong, S. L., Rhu, M., Kim, J. et al. (2015). CLEAN-ECC: high reliability ECC for adaptive granularity memory system. Proceedings of the 48th International Symposium on Microarchitecture, 611-622.

* cited by examiner

DATA PROTECTION TECHNIQUES FOR A NON-VOLATILE MEMORY ARRAY

BACKGROUND OF THE INVENTION

This disclosure relates to data processing and storage, and more specifically, to data protection techniques that combine error correcting code and redundant array of independent disk functionality for a non-volatile memory array.

As is known, most communication channels are subject to channel noise that may introduce errors in data during transmission of the data from a source to a receiver. Error detection and correction techniques facilitate reliable delivery of digital data over unreliable communication channels. Error detection and correction techniques also facilitate reliable storage of digital data in non-volatile memory (NVM) arrays. In sum, error detection techniques facilitate detecting data errors, while error correction techniques facilitate reconstruction of original data from corrupted data in many instances. An error-correcting code (ECC) is used for protecting a sequence of symbols such that errors introduced in the sequence of symbols can be detected and corrected (within limitations) based on symbols that are not corrupted. In general, error detection is less complex than error correction.

Reed-Solomon (RS) codes are linear block-based ECCs that have a wide range of applications in digital communications and storage. RS codes are commonly used to correct errors in many electronic systems and are a subset of Bose-Chaudhuri-Hocquenghem (BCH) codes. An RS encoder receives a digital data block and adds extra parity symbols. An RS decoder processes each noisy data block and attempts to correct errors and recover original data based on the redundancy given by the extra parity symbols. The number and type of errors that can be corrected with an RS code depends on the characteristics of an implemented RS code. An RS code over the finite field $GF(2^s)$ may be specified as $RS(n, k)$ with s-bit symbols, which means that an RS encoder takes 'k' data symbols of 's' bits each and adds symbols to make an 'n' symbol codeword, with 'n-k' added parity symbols of 's' bits each. In general, an RS decoder can correct up to T symbols that contain errors in a codeword, where t is the largest integer not exceeding $(n-k)/2$.

A redundant array of independent disks (RAID) refers to a data storage technology that has been used to combine multiple hard disk drives (HDDs) or solid state drives (SSDs) into a single logical unit for the purposes of data redundancy and/or performance improvement. With RAID, data is distributed across drives in one of several ways, depending on the required level of redundancy and/or performance. Different RAID levels provide a different balance between capacity, performance, availability, and reliability. RAID levels greater than RAID '0' provide protection against unrecoverable sector read errors, as well as against failures of whole drives.

BRIEF SUMMARY

A data protection technique is disclosed that combines error correcting code and redundant array of independent disk functionality for a non-volatile memory array of a data storage system. The technique includes receiving, by a controller, data for storage in a non-volatile memory (NVM) array of the data storage system. In response to receiving the data for storage in the NVM array, the controller forms first component codewords based on encodings with a first level code of respective first portions of the data. In response to receiving the data for storage in the NVM array, the controller forms a second component codeword based on an encoding with a second level code of a second portion of the data and the first component codes. The controller stores a respective portion of each of the first and second component codewords on packages of the NVM array. The storing achieves maximum equal spreading of each of the component codewords across all of the packages.

The disclosed techniques may be implemented as a method, a data storage system, and/or a program product (including program code stored in a storage device).

DETAILED DESCRIPTION

Figure 1A:
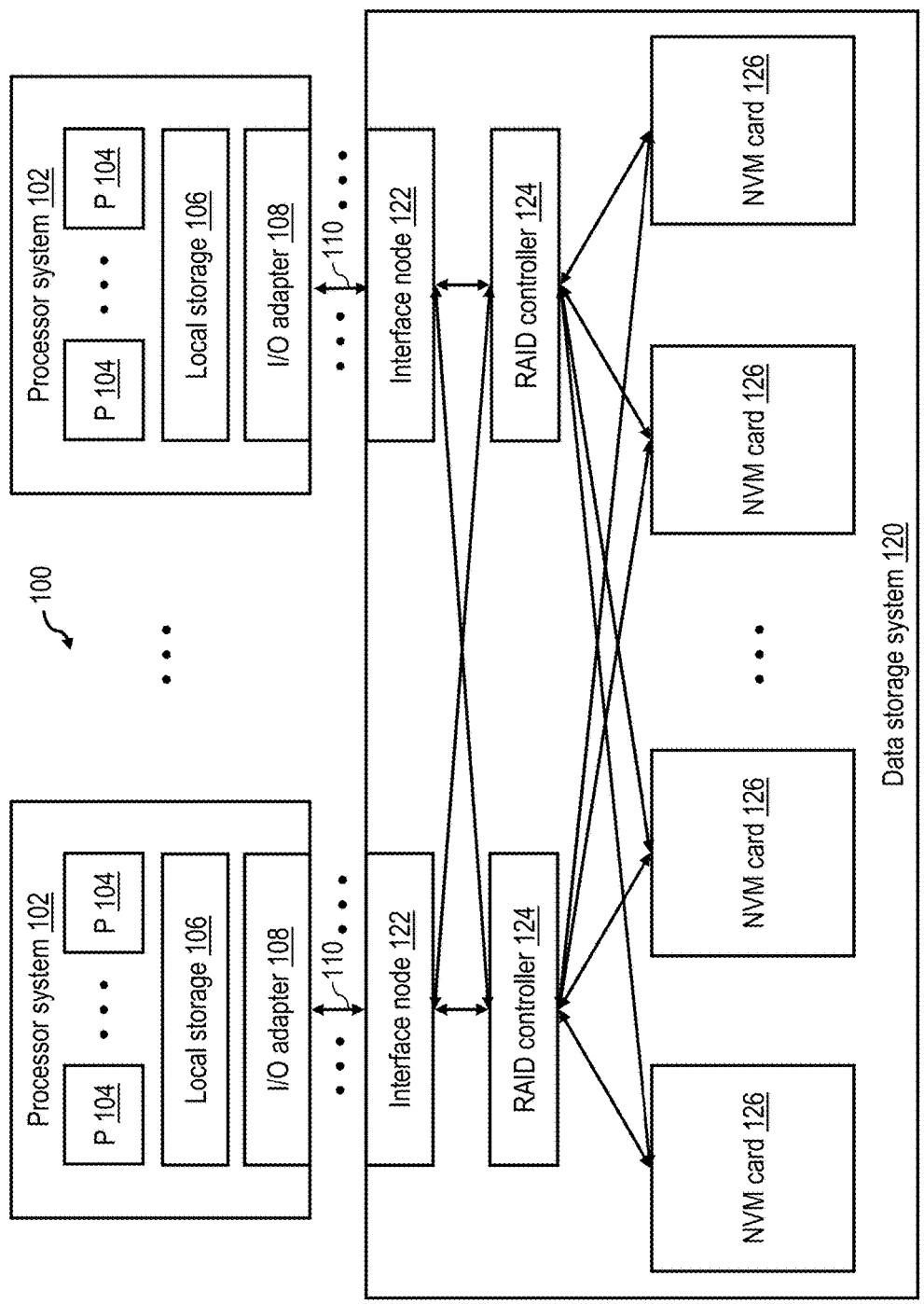
FIG. 1A is a high level block diagram of a data processing environment in accordance with one embodiment.

Given that dynamic random access memory (DRAM) devices have a relatively low raw bit error rate (RBER), e.g., 1 bit error in $10^{15}$ bits or lower, error correcting code (ECC) functionality has typically not been required to protect a data storage system that implements DRAM devices from data loss. However, in DRAM-based data storage systems a redundant array of independent disks (RAID) functionality has been used across DRAM packages to protect against a single DRAM package failure. In data storage systems that have employed hard disk drives (HDDs), sectors of an HDD have been protected from data loss by ECC functionality and disks have been protected from data loss by RAID functionality. Unfortunately, protecting sectors of an HDD from data loss has conventionally required a relatively long ECC that has not facilitated maximizing a bandwidth of an associated data storage system. Approaches similar to those that have been used to protect HDDs have also been used in conjunction with flash memory arrays of a data storage system. While implementing a single ECC that spans across packages of a non-volatile memory (NVM) array of a data storage system has supported a relatively high code rate (which minimizes overhead), implementing a single ECC that spans across all packages of an NVM array has required a relatively complex ECC, which has conventionally required a relatively complex hardware implementation that has not readily supported a high bandwidth requirement at low cost.

NVM arrays have usually included a collection of packages (devices), with data flow between a host data processing system and the NVM array being controlled by a storage controller. An NVM array typically includes a predetermined number of packages, each of which include a predetermined number of dies. Typically, a storage controller has been configured to access data in all packages in parallel and, as such, a bandwidth of an NVM array has been proportional to the number of packages accessed in parallel. To achieve maximum bandwidth for a given constellation of packages it is desirable to read/write from/to a maximum number of packages, for which a storage controller is designed, in parallel. As the latency of accessing a data record depends on the size of the record, spreading a data record across multiple packages and accessing the data record in parallel tends to reduce data access latency.

Next-generation NVMs, e.g., next-generation phase change memories (PCMs), have been proposed that implement semiconductor devices that are configured to sustain data at power loss, support relatively small granularity data access (e.g., down to several bytes), and can be read/written relatively fast (e.g., read/written in a few 100 nanoseconds) to support relatively high throughput. Unfortunately, next-generation NVM devices tend to exhibit a relatively large raw bit error rate (RBER), e.g., up to about 1 bit error in $10^3$ bits, as the NVM devices approach end-of-life. To ensure high reliability of stored user data, a relatively strong ECC is required to achieve uncorrectable bit error rate (UBER) of around 1 bit error in $10^{15}$ bits. Component and wire aging and other physical/programming effects can cause entire package failures, which can lead to substantial data loss (e.g., an entire package or more).

In general, it is desirable for a storage controller for next-generation NVM devices to support relatively high bandwidth, relatively low latency, and relatively high BER reliability, as well as exhibiting robustness to package failure. In addition, it is desirable for a storage controller to provide high overall efficiency, i.e., high ratio of user data to stored data, as next-generation NVM devices are typically of higher cost/GB, e.g., as compared to flash memory devices. As NVM controllers of data storage systems are typically implemented in field programmable gate arrays (FPGAs), e.g., for fast time-to-market, maintaining a small silicon area is desirable.

Current state-of-the-art data protection schemes either have limitations in terms of bandwidth, latency, hardware complexity, or they require an unacceptable large data overhead, which leads to low efficiency. According to the present disclosure, a high-bandwidth, high-efficiency, low-complexity data protection technique is disclosed that combines ECC and RAID functionality for next-generation NVM arrays. According to one embodiment, codewords (CWs) are spread across all packages of an NVM array and a package failure is recovered by erasure decoding. In one or more embodiments, an implemented ECC is a concatenated (two-tier) code that includes short interleaved Reed-Solomon (RS) codes (i.e., C1 codes) that are protected by a strong RS sub-code (i.e., a C2 code). By spreading CWs across all packages data access times are minimized which leads to higher bandwidths. According to the present disclosure, protection against any single package failure is guaranteed, along with correction of random errors. In general, implementing a concatenated RS-based code reduces hardware complexity (as contrasted with a single long code), offers an improved bit-error-rate performance/code rate (as compared to short interleaved codes), and offers faster decoding as in most cases (~$10^8$ to 1) the fast C1 decoder is used and the slower more complex C2 decoder is not needed (two-tier decoding principle). The disclosed integrated ECC/RAID techniques can be advantageously implemented entirely in hardware, which avoids lengthy verification typically associated with firmware implementations.

With reference to the figures and with particular reference to FIG. 1A, there is illustrated a high level block diagram of an exemplary data processing environment 100 including a data storage system 120 that is configured to implement outer redundant array of independent disk (RAID) functionality across NVM cards 126 and data protection techniques that combine error correcting code (ECC) and redundant array of independent disk (RAID) functionality for a non-volatile memory (NVM) array within the NVM cards 126 according to the present disclosure. As shown, data processing environment 100 includes one or more hosts, such as a processor system 102 having one or more processors 104 that process instructions and data. Processor system 102 may additionally include local storage 106 (e.g., Dynamic Random Access Memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER® series available from International Business Machines Corporation), or a mainframe computer system. Processor system 102 can also be an embedded processor system using various processors such as ARM®, POWER, Intel X86, or any other processor combined with memory caches, memory controllers, local storage, I/O bus hubs, etc.

Each processor system 102 further includes an Input/Output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), Infini-Band, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

In the illustrated embodiment, data storage system 120 includes multiple interface nodes 122 through which data storage system 120 receives and responds to IOPs via I/O channels 110. Each interface node 122 is coupled to each of multiple outer Redundant Array of Inexpensive Disks (RAID) controllers 124 in order to facilitate fault tolerance and load balancing. Each of outer RAID controllers 124 is in turn coupled (e.g., by a PCIe bus) to each of multiple NVM cards 126 including, in this example, NVM storage media. In other embodiments, other lossy storage media can be employed.

Figure 1B:
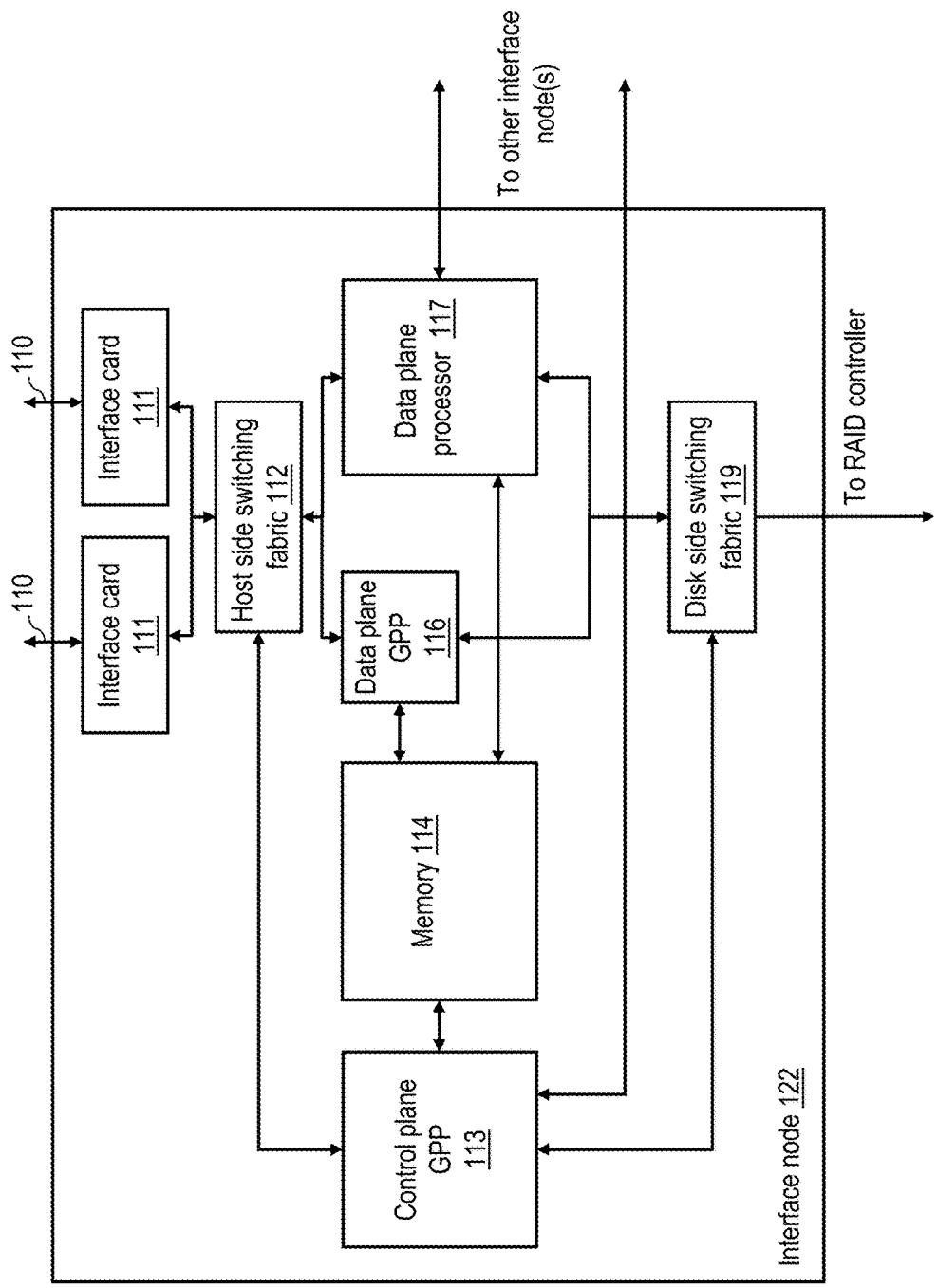
FIG. 1B is a more detailed block diagram of an exemplary interface node of the data storage system of FIG. 1A.

FIG. 1B depicts a more detailed block diagram of an interface node 122 of data storage system 120 of FIG. 1A. Interface node 122 includes one or more interface cards 111 that serve as an interface to processor systems 102 through I/O channels 110 and connect to host side switching fabric 112. The host side switching fabric 112 acts as a switch and handles all data transfers between interface cards 111 and processing units in interface node 122, namely control plane general purpose processor (GPP) 113, data plane GPP 116, and data plane processor 117. Typically, host side switching fabric 112 consist of a PCIe switch, but other switch technologies may be used as well. Data plane processor 117 is a special purpose processor that can be implemented, for example, by an Application Specific Integrated Circuit (ASIC) or a Field Programmable Gate Array (FPGA). Control plane GPP 113, data plane GPP 116, and data plane processor 117 are all connected to memory 114 which may be implemented as a shared memory between these components, separate memories, or a combination thereof.

In embodiments in which data plane processor 117 is implemented with an FPGA, control plane GPP 113 may program and configure data plane processor 117 during start-up of data storage system 120. Data plane GPP 116 and control plane GPP 113 control data plane processor 117 as well as access to NVM cards 126 either indirectly through the control of data plane processor 117 or directly through disk side switching fabric 119. Control plane GPP 113 executes system management functions as well as higher level services such as snapshots, thin provisioning, and deduplication. Data plane GPP 116 executes protocol specific functions. Control plane GPP 113, data plane GPP 116, and data plane processor 117 are connected to outer RAID controller 124 through disk side switching fabric 119 which typically consist of a PCIe switch, but other switch technologies may be used as well. FIG. 1B further illustrates control plane GPP 113 and data plane processor 117 being connected to other interface nodes 122 in data storage system 120 to handle fail-over scenarios or for performing other data synchronization functions.

Figure 1C:
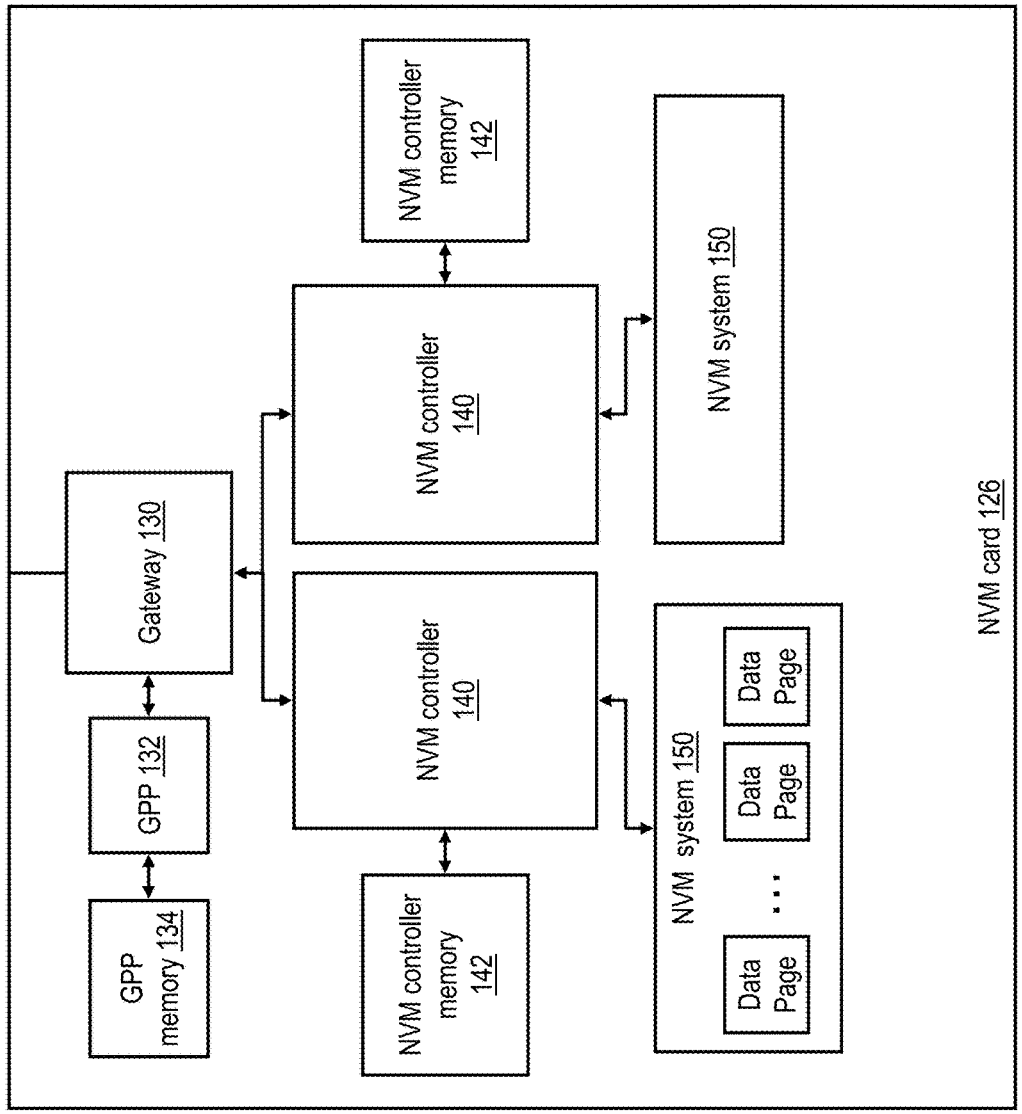
FIG. 1C is a more detailed block diagram of an exemplary non-volatile memory (NVM) card of the data storage system of FIG. 1A.

FIG. 1C depicts a more detailed block diagram of an NVM card 126 of data storage system 120 of FIG. 1A. NVM card 126 includes a gateway 130 that serves as an interface between NVM card 126 and outer RAID controllers 124. Gateway 130 is coupled to a general-purpose processor (GPP) 132, which can be configured (e.g., by program code) to perform various management functions, such as pre-processing of IOPs received by gateway 130 and/or to schedule servicing of the IOPs by NVM card 126. GPP 132 is coupled to a GPP memory 134 (e.g., Dynamic Random Access Memory (DRAM) or Magneto-resistive Random Access Memory (MRAM)) that can conveniently buffer data created, referenced and/or modified by GPP 132 in the course of its processing.

Gateway 130 is further coupled to multiple NVM controllers 140, each of which controls a respective NVM system 150. The NVM controllers 140 implement the combined ECC/RAID data protection techniques for a NVM array according to the present disclosure. NVM controllers 140 can be implemented, for example, by an Application Specific Integrated Circuit (ASIC) or a Field Programmable Gate Array (FPGA) having an associated NVM controller memory 142 (e.g., DRAM). In embodiments in which NVM controllers 140 are implemented with an FPGA, GPP 132 may program and configure NVM controllers 140 during start-up of data storage system 120. After startup, in general operation NVM controllers 140 receive read and write IOPs from gateway 130 that request to read data stored in NVM system 150 and/or to store data in NVM system 150. NVM controllers 140 service these IOPs, for example, by accessing NVM systems 150 to read or write the requested data from or into NVM systems 150 or by accessing one or more read and/or write caches (not illustrated in FIG. 1C) associated with NVM systems 150.

NVM controllers 140 implement a translation layer that provides logical-to-physical address translation to enable access to specific memory locations within NVM systems 150. In general, an IOP received by NVM controller 140 from a host device, such as a processor system 102, contains the logical block address (LBA) at which the data is to be accessed (read or written) and, if a write IOP, the write data to be written to data storage system 120. The IOP may also specify the amount (or size) of the data to be accessed. Other information may also be communicated depending on the protocol and features supported by data storage system 120. The LBA provided by the host device corresponds to a logical page within a logical address space, the logical page typically having a size in the range between 512 bytes to four (4) kilobytes. The translation layer translates this LBA into a physical address assigned to a corresponding physical location in a NVM system 150.

NVM controllers 140 may perform address translation and/or store mappings between logical and physical addresses in a logical-to-physical translation data structure, such as a logical-to-physical translation (LPT) table, which may conveniently be stored in NVM controller memory 142. An LPT table may also be configured to store compressed page sizes of data pages stored in NVM system 150 and even further their CRC values.

Figure 2:
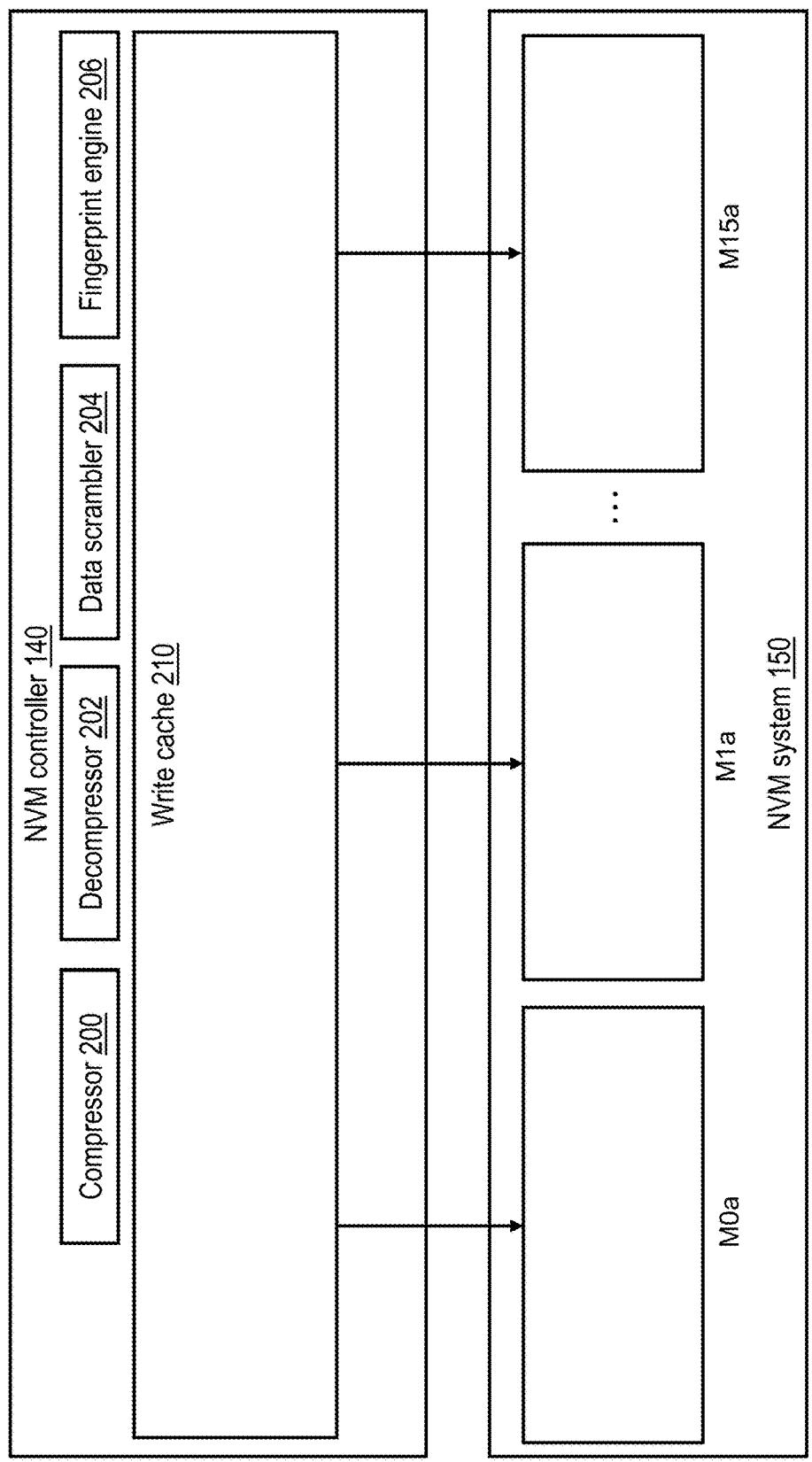
FIG. 2 depicts a more detailed view of an exemplary NVM controller and an exemplary NVM system of FIG. 1C.

NVM systems 150 may take many forms in various embodiments. Referring now to FIG. 2, there is depicted one exemplary arrangement of physical memory within a NVM system 150 in accordance with one exemplary embodiment.

NVM system 150 may be formed from thirty-two (32) individually addressable NVM storage devices, which will be referred to as packages. In the illustrated example, each of the NVM storage devices M0a-M15b takes the form of a board-mounted NVM module capable of storing one, two or more bits per cell. Thus, NVM modules may be implemented with Single Level Cell (SLC), Multi-Level Cell (MLC), Three Level Cell (TLC), Quad Level Cell (QLC) memory, or another type of NVM. The thirty-two NVM modules are arranged in sixteen groups of two, (M0a, M0b) through (M15a, M15b). For purposes of the physical addressing scheme, each group of two modules forms a "lane," also sometimes referred to as a "channel," such that NVM system 150 includes sixteen channels or lanes (Lane0-Lane15).

In a preferred embodiment, each of the individual lanes has a respective associated bus coupling it to the associated NVM controller 140. Thus, by directing its communications to one of the specific communication buses, NVM controller 140 can direct its communications to one of the lanes of memory modules. Because each communication bus for a given lane is independent of the communication buses for the other lanes, a NVM controller 140 can issue commands and send or receive data across the various communication buses at the same time, enabling the NVM controller 140 to access the NVM modules corresponding to the individual lanes at, or very nearly at, the same time.

In the illustrated embodiment, NVM controller 140 includes a compressor 200 that selectively applies one or more data compression algorithms to data written to the associated NVM system 150, a decompressor 202 that decompresses compressed data read from NVM system 150, and a data scrambler 204. NVM controller 140 utilizes data scrambler 204 to apply a predetermined data scrambling (i.e., randomization) pattern to data written to NVM memory 150 in order to improve endurance. As further illustrated in FIG. 2, NVM controller 140 includes a write cache 210. Write cache 210 includes storage for one or more cache lines for buffering write data in anticipation of writing the data to NVM system 150.

As previously mentioned, according to various aspects of the present disclosure, each codeword (CW) is spread across all packages of an NVM array. In one or more embodiments, an implemented ECC is a concatenated (two-tier) code that includes short interleaved Reed-Solomon (RS) codes (i.e., C1 codes) that are protected by a strong RS sub-code (i.e., a C2 code). By spreading CWs across all packages data access times are minimized which leads to higher bandwidths. In various embodiments, implementing a two-tier code guarantees protection against any single package failure while providing for the correction of random errors. In general, implementing a concatenated RS-based code reduces hardware complexity (as contrasted with a single long code), offers an improved bit-error-rate performance/code rate (as compared to short interleaved codes), and offers faster decoding as in most cases ($\sim 10^8$ to 1) the fast C1 decoder is used and the slower more complex C2 decoder is not needed (two-tier decoding principle).

Figure 3:
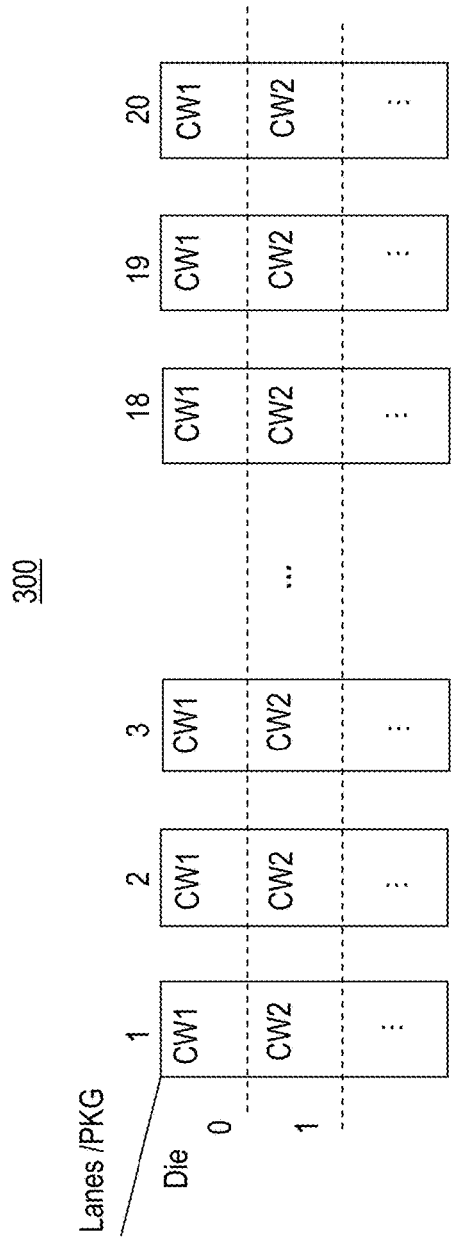
FIG. 3 is a diagram that depicts an exemplary codeword (CW) spread across packages of an NVM array according to one aspect of the present disclosure.
Figure 4:
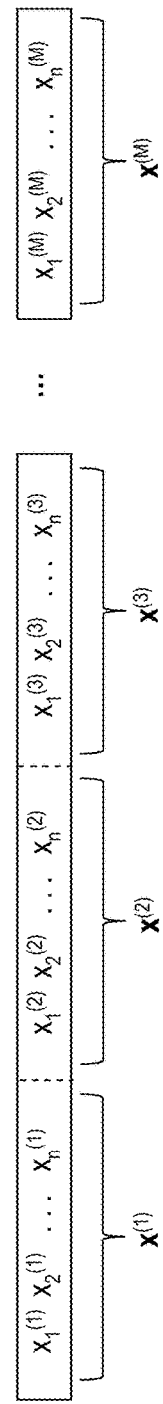
FIG. 4 is a diagram that depicts an exemplary concatenated CW that includes a number of component codewords according to an aspect of the present disclosure.

With reference to FIG. 3, a diagram 300 illustrates an exemplary concatenated codeword (CW) that is spread across twenty packages (P=20) of an NVM array, according to an aspect of the present disclosure. While twenty packages are illustrated in FIG. 3, it should be appreciated that the disclosed techniques are applicable to NVM arrays that include more or less than twenty packages. With reference to FIG. 4, a diagram 400 further depicts an exemplary concatenated CW x that includes 'M' component codewords $x^{(1)}, x^{(2)}, \ldots, x^{(M)}$, which satisfy the following encoding constraints:
   a) each component codeword belongs to a length-n code C1 (local constraint: level-1); and
   b) the XOR sum $x^{(1)} \oplus x^{(2)} \oplus \ldots \oplus x^{(M)}$ belongs to a sub-code C2 of C1 (global constraint: level-2).

When C1 and C2 are Reed-Solomon (RS) codes the class of concatenated codes has been referred to as Integrated Interleaved Codes, as described in "Integrated Interleaving—A Novel ECC Architecture," M. Hassner, et al., IEEE Trans. on Magn., vol. 37, no. 2, pp. 773-775, March 2001, and U.S. Pat. Nos. 5,946,328, 5,942,005 and 7,231,578 B2. Such two-level coding schemes using interleaved RS codes have been employed in HDDs. These systems are based on the generalized concatenated codes described, for example, by E. L. Blokh and V. V. Zyablov in "Generalized concatenated codes," Plenum Publishing Corporation, pp. 218-222, 1976 (translated from Problemy Peredachi Informatsii, vol. 10, No. 3, pp. 45-50, July-September, 1974); and by J. Maucher et al. in "On the Equivalence of Generalized Concatenated Codes and Generalized Error Location Codes", IEEE Trans. on Information Theory, vol. 46, no. 2, March 2000.

The two-level RS coding scheme of Hassner et al. referenced above uses first and second level RS codes, denoted by C1 and C2 respectively, where the second RS code is a sub-code of the first RS code. Code constructions of concatenated codes satisfying local and global constraints a) and b) mentioned above are not limited to RS codes but can be extended to more general classes of codes such as BCH codes (see U.S. Pat. No. 8,930,798). In particular, the global constraint b) can be generalized to multiple constraints in the form of predetermined linear combinations of the M first codewords producing a second codeword of the C2 subcode. It should be appreciated that a concatenated CW configured according to the present disclosure may include any number of component codewords. In one embodiment, 'M' is equal to five and four C1-encoders are implemented in conjunction with a single C2-encoder. In one or more embodiments, C1 and C2 are 8-bit-symbol Reed-Solomon (RS) codes RS(n, $k_1$, $t_1$, $e_1$) and RS(n, $k_2$, $t_2$, $e_2$), respectively, where 'n' corresponds to the length of the codes in bytes, $k_1$ corresponds to the number of user bytes in the C1 code, $t_1$ corresponds to the number of errors that can be corrected by the C1 code, $e_1$ corresponds to the number of byte erasures that can be corrected by the C1 code, $k_2$ corresponds to the number of user bytes in the C2 code, $t_2$ corresponds to the number of errors that can be corrected by the C2 code, and $e_2$ corresponds to the number of byte erasures that can be corrected by the C2 code. It should be appreciated that the class of RS and BCH codes admit low-complexity error-and-erasure decoding algorithms, which is important to achieve high (readback) bandwidth.

In one or more embodiments, a last component $x^{(M)}$ of the concatenated CW x is derived by exclusive ORing (XORing) the C2 codeword with the C1 codewords in each concatenated CW. In one or more embodiments, the concatenated CW x can correct up to $t_1$ errors in each component codeword (tier 1) and $t_2$ errors in the worst component codeword (tier 2). As one example, for a concatenated CW having five component codewords each with a length 'n' of 248B, a length 'N' of the concatenated CW is 1240B (i.e., N=5×248B). For example, $k_1$ may be set equal to 209 and $k_2$ may be set equal to 195, which corresponds to $t_1$=13, $e_1$=13 and $t_2$=20, $e_2$=13, respectively. The resulting length-1240 concatenated code can encode $K=4k_1+k_2=1031$ bytes of user data. Assuming an NVM array having twenty packages (i.e., P=20) with each package having 64B there are two spare bytes per package (i.e., 1240B=20×62B) that can be used to replace bytes that fail prematurely.

As another example, assume a concatenated CW including twelve component codewords (i.e., M=12) and twenty-four packages (i.e., P=24) in an NVM array, a C1 code defined by an 8-bit-symbol RS(n=216, $k_1$=179, $t_1$=13, $e_1$=9) can be used to provide eleven component codewords and a C2 code defined by an 8-bit-symbol RS(n=216, $k_2$=165, $t_2$=20, $e_2$=9) can be used to generate a C2-codeword, which (by XORing with the first eleven component codewords) provides a single component codeword (twelve component codes in total) to provide data protection according to the present disclosure. In this case, n/P=9 bytes from each of the twelve component codewords is written to each package, which facilitates recovery from a single package failure. More generally, if the length n of the component codewords is a multiple of the number of packages P, the mapping of ECC data to packages assigns n/P symbols from each of the M component codes to each package. In this case, a uniform spreading is achieved, i.e., each package contains exactly n/P symbols from each of the M component codewords, which adds up to M×n/P symbols per package and to a total of M×n symbols across all P packages. If the length n of the component codewords is not a multiple P, a fully uniform spreading is not possible and one seeks to achieve a spreading that is as uniform as possible. This is achieved by requiring that each package receives at most e=ceil(n/P) symbols but no less than e−1 symbols from each of the M component codewords, where ceil(n/P) denotes the smallest integer that is larger or equal to n/P. The parameter e determines the required erasure capability of the C1 and C2 codes, which is needed to recover from a single package failure. The disclosed mapping of ECC data to packages achieves maximum equal spreading of each of the component codewords across all packages. In general, there are many ways to achieve a maximum equal spreading, e.g., the nine bytes from each of the twelve component codewords can be adjacent bytes in the component codeword but also many other non-adjacent configurations are possible. This maximum equal spreading property ensures that the erased data from a package failure is evenly distributed across all component codewords and therefore the least number of bytes will be erased on each component codeword. Thus, when designing the ECC and selecting the ECC parameters of the C1 and C2 codes, the maximum equal spreading property allows one to choose the erasure correction capability e of the C1 and C2 codes as small as possible, which results in the largest possible code rate of the concatenated code.

Figure 5:
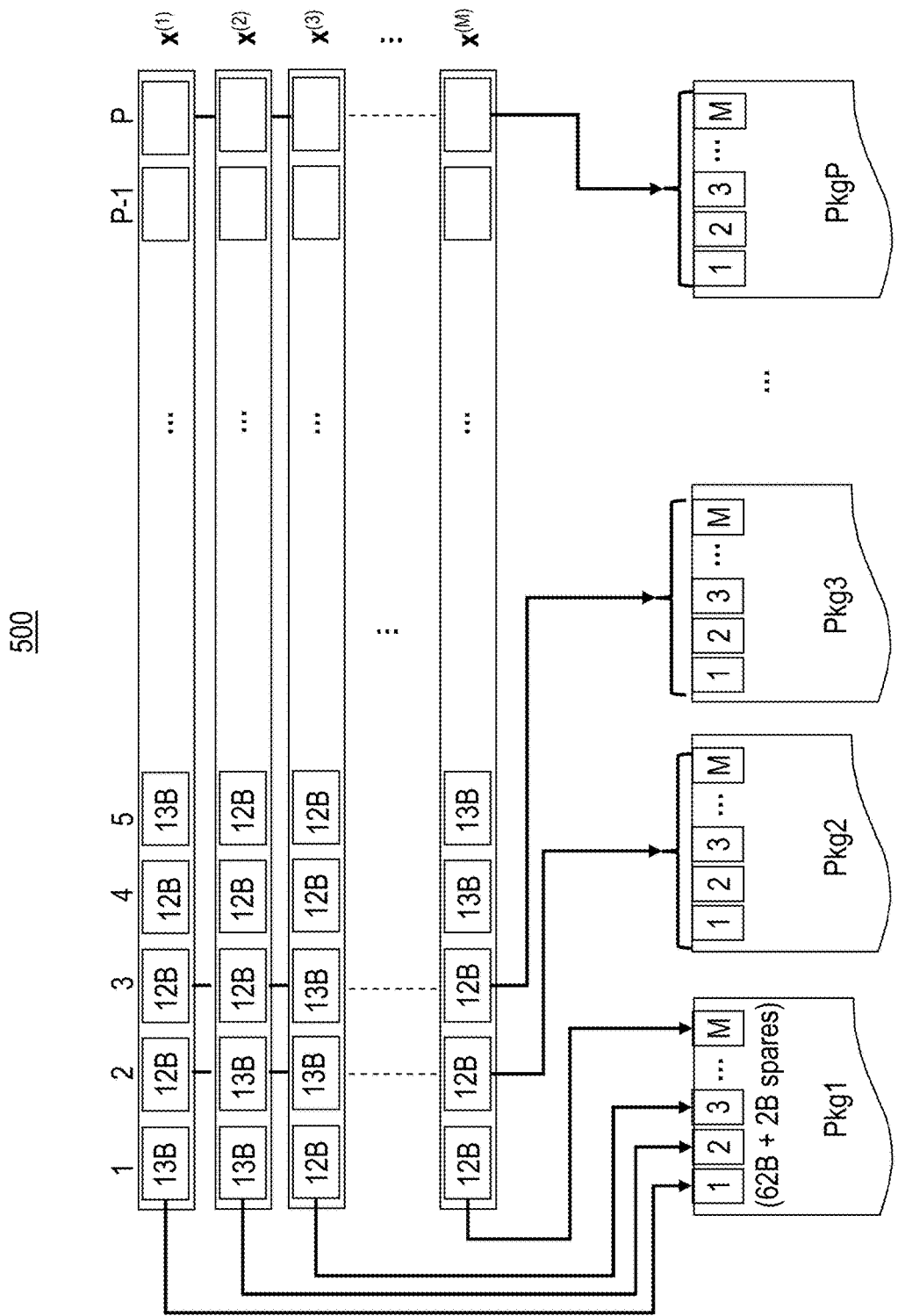
FIG. 5 is a diagram that depicts exemplary interleaving with maximum equal spreading of data from the component codewords $(x^{(1)}-x^{(M)})$ to packages (Pkg1-PkgP) in accordance with one embodiment of the present disclosure.

With reference to FIG. 5, a diagram 500 depicts an exemplary interleaving of data from component codewords to packages in accordance with one embodiment of the present disclosure. As is illustrated, data from each component codeword $x^{(1)}, x^{(2)}, \ldots, x^{(M)}$, of a concatenated CW x is assigned to each package. This ECC data to package mapping is exemplified for the length-1240 concatenated code with K=1031 user bytes and five (i.e., M=5) component codewords of length n=248 described above. As one example, for a concatenated CW with five component codewords and twenty packages (P=20) in an NVM array, a first 13B of component codeword $x^{(1)}$, a first 13B of component codeword $x^{(2)}$, a first 12B of component codeword $x^{(3)}$, a first 12B of component codeword $x^{(4)}$, and a first 12B of component codeword $x^{(5)}$ may be allocated to a first package of an NVM array (13B+13B+12B+12B+12B=62B). Similarly, a next 12B of component codeword $x^{(1)}$, a next 13B of component codeword $x^{(2)}$, a next 13B of component codeword $x^{(3)}$, a next 12B of component codeword $x^{(4)}$, and a next 12B of component codeword $x^{(5)}$ may be allocated to a second package of an NVM array with a size of subsequent bytes from the component codewords being rotated for successive packages. It should be appreciated that different allocations may be made providing that each package is allocated the same overall data bytes (e.g., in this case 62B) from a CW, that all data bytes in a CW are allocated to a package, and that the implemented C1 and C2 codes can correct erasures for the maximum amount of e=ceil(n/P) bytes (13B in this example) in the event of a single package failure. This mapping of ECC data to packages achieves maximum equal spreading of each of the component codewords across all packages.

Figure 6:
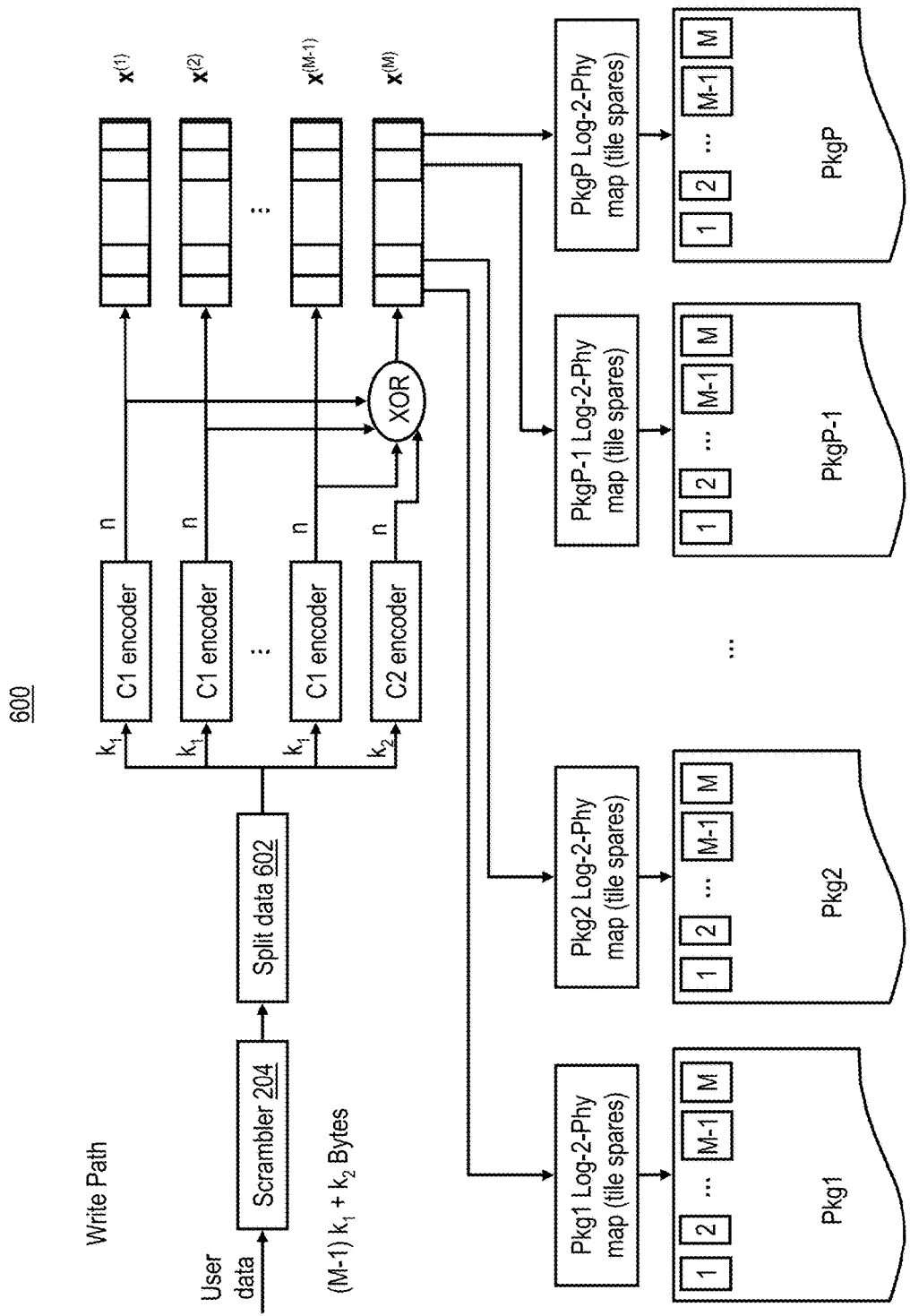
FIG. 6 depicts an exemplary encoder for encoding component codewords for a concatenated CW and interleaving with maximum equal spreading of data from the component codewords to packages in accordance with one embodiment of the present disclosure.

With reference to FIG. 6, an exemplary encoder 600 for creating component codewords (i.e., $x^{(1)}, \ldots, x^{(M)}$) for a concatenated CW (i.e., x) is further illustrated in conjunction with the interleaving of data from the component codewords to packages of an NVM array in accordance with an embodiment of the present disclosure. As illustrated, encoder 600 includes a data scrambler 204, a split data module 602, multiple (i.e., M−1) C1 encoders, a single C2 encoder, and XOR logic that XORs outputs of the C1 and C2 encoders to generate a last component codeword $x^{(M)}$ for each concatenated CW. As one example, for a concatenated CW that includes five component codewords (i.e., M=5) four C1 encoders and one C2 encoder are implemented. As is shown, data scrambler 204 receives (M−1)×$k_1$+$k_2$ bytes of user data for each concatenated CW and scrambles the user data, which is then provided to an input of split data module 602. Split data module 602 splits the scrambled user data and then routes designated portions of the split scrambled user data to respective inputs of the C1 encoders and the C2 encoder. Each of the C1 and C2 encoders receive a designated portion of the split scrambled user data, encode the designated portion of the split scrambled user data, and then provide 'n' bytes of encoded data at their respect outputs that correspond to respective component codewords of the concatenated CW. A respective portion of the encoded data in each component codeword is then routed to each package based on the maximum equal spreading property as discussed in conjunction with FIG. 5.

Figure 7:
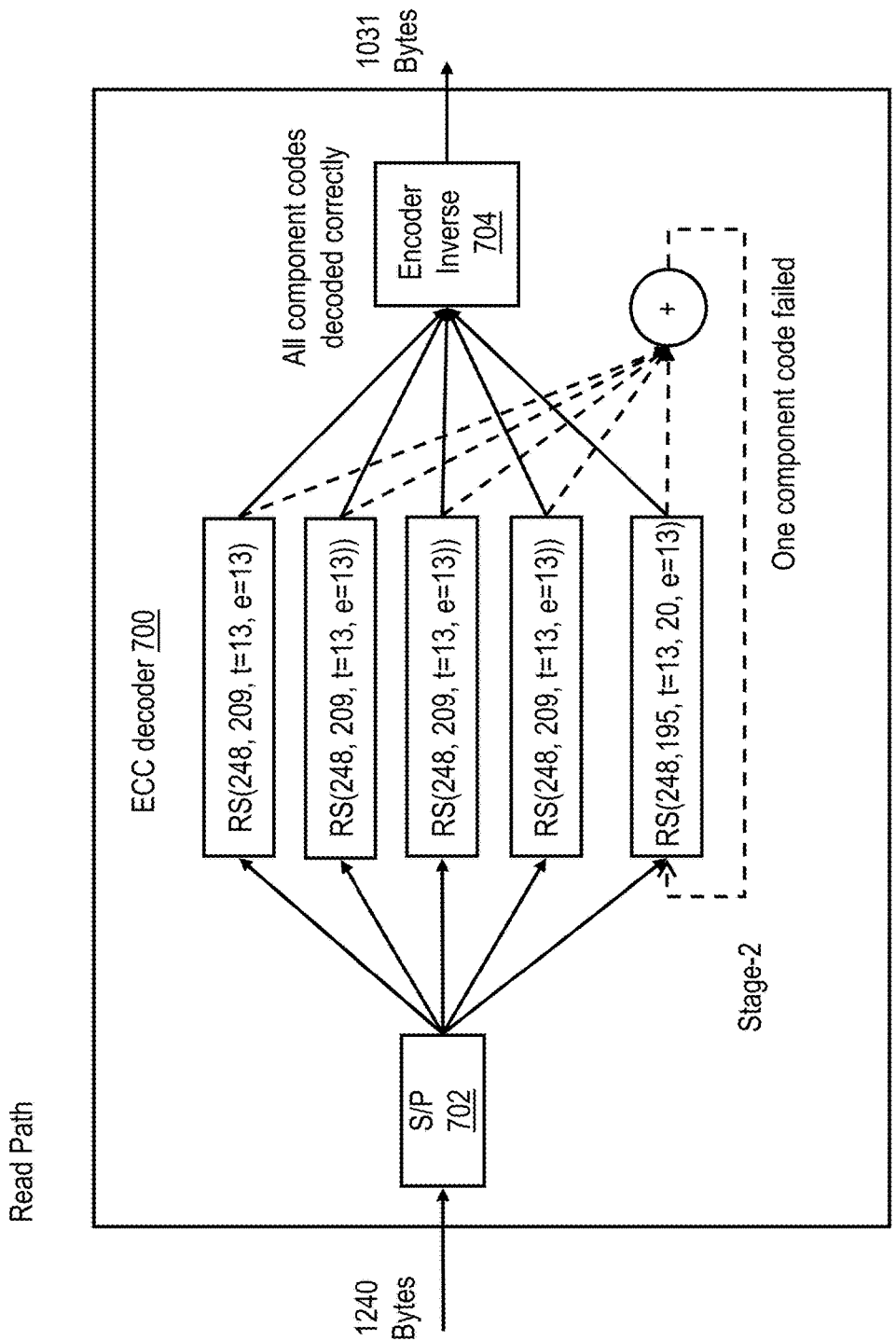
FIG. 7 depicts an exemplary decoder for decoding concatenated CWs in accordance with one embodiment of the present disclosure.

With reference to FIG. 7, an exemplary ECC decoder 700 for decoding concatenated CWs, in accordance with one embodiment of the present disclosure, is illustrated for the length-1240 concatenated code with K=1031 user bytes described above. In the illustrated embodiment, ECC decoder 700 includes five decoders (i.e., four C1 decoders defined by RS(248, 209, t=13, e=13) and one C1/C2 decoder defined by RS(248, 195, t=13, 20, e=13)) used to decode different component codewords corrupted by errors of a concatenated CW that includes five component codewords, a serial-to-parallel (S/P) converter 702, and an encoder inverse module 704. In ECC decoder 700 each noisy component codeword is decoded independently in a first round (tier 1). If all noisy component codewords are decoded successfully in the first round, the outputs of the decoders are combined by module 704 and provided at the output of module 704. If one component is not decoded successfully, a second round of decoding is required (tier 2). The second round of decoding is performed by a C1/C2 decoder that is configured to perform C1 decoding in the first round (tier 1) and C2 decoding in the second round (tier 2). In tier-2 decoding mode, the noisy component codeword that has failed C1 decoding is XORed with all the M−1=4 successfully decoded component codewords and this XOR sum is passed to the C1/C2 decoder, which operates in C2 decoding mode. In a typical case, tier-2 decoding is required in about 1 in $10^8$ frames. In the event that a single package fails, error and erasure decoding is performed to recover the erased data associated with the single package. If all component codewords are decoded successfully in the first or second round, the outputs of the decoders are combined by module 704 and provided at the output of module 704.

Figure 8:
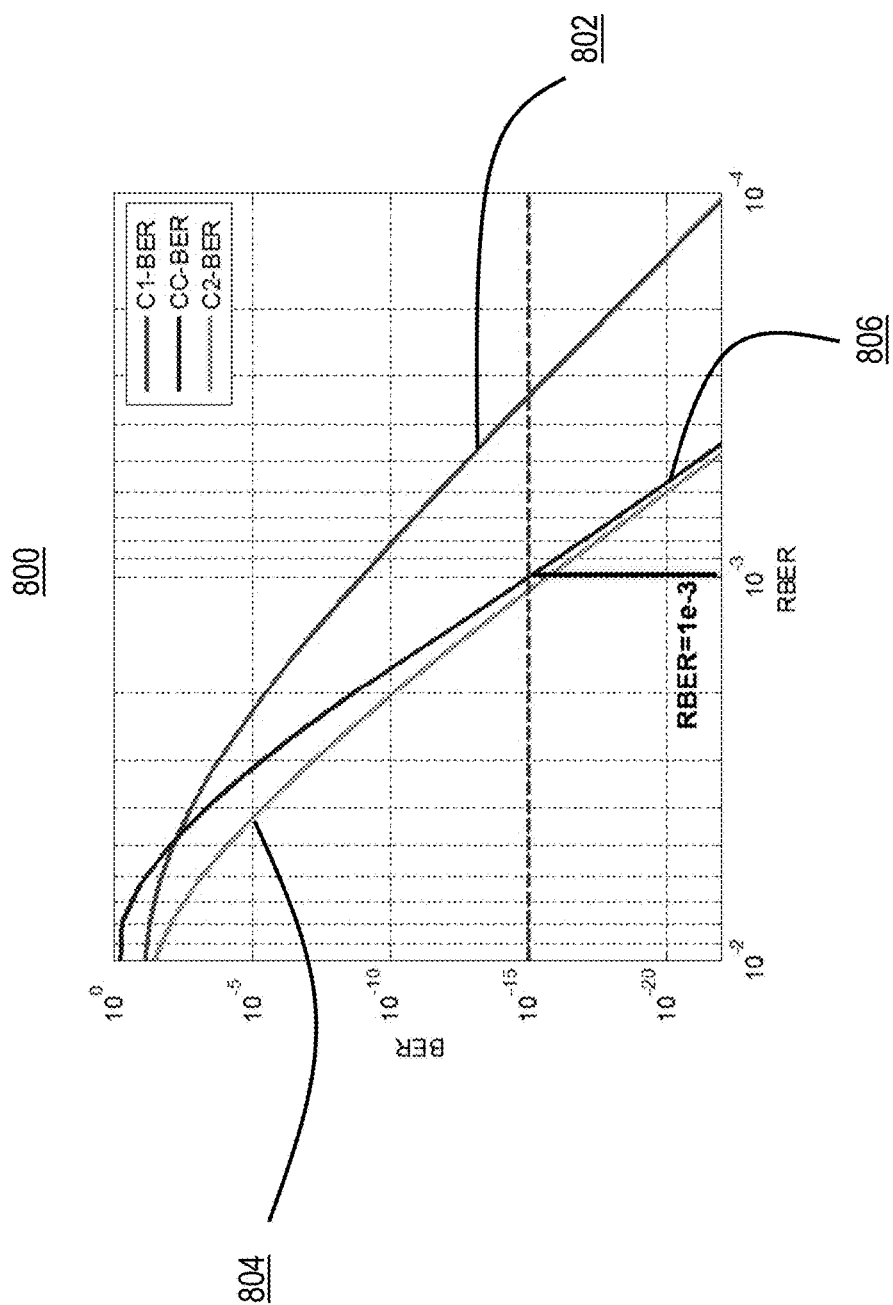
FIG. 8 depicts an exemplary graph illustrating a relationship between a bit error rate (BER) of the decoder output and a raw BER (RBER) at the decoder input for exemplary first level code (i.e., C1 code), an exemplary second level code (i.e., a C2 code), and an exemplary concatenated code (CC) that is based on the first and second level codes in accordance with various aspects of the present disclosure.

With reference to FIG. 8, an exemplary graph 800 illustrates the code performance in terms of decoder-output bit error rate (BER) and random raw BER (RBER) at the decoder input for an exemplary C1 code (C1-BER) 802 defined by RS(248, 209, $t_1$=13, $e_1$=13), an exemplary C2 code (C2-BER) 804 defined by RS(248, 195, $t_2$=20, $e_2$=13), and an exemplary concatenated code (CC-BER) 806 of length N=1240 and dimension K=1031 with first and second level C1 and C2 codes having five component codewords (i.e., M=5), as described above. In graph 800, the code performances were determined analytically by a method described by X. Tang and R. Koetter in "On the Performance of Integrated Interleaving Coding Schemes," Conference: Signals, Systems and Computers, 2002. Conference Record of the Thirty-Sixth Asilomar Conference on, Volume: 1, pp.

267-271. In the C1 code, $e_1$ is the erasure correction capability in bytes. In the C2 code, $e_2$ is the erasure correction capability in bytes. The erasure correction capabilities have been selected to be $e_1=13=e_2$ because in the exemplary data interleaving described in FIG. 5, the largest pattern within any of the five component codewords, which is affected by a single package failure, consists of e=ceil(n/P)=13B. Using the disclosed techniques, at an RBER of 1 bit error in $10^3$ bits and with erasure locations corresponding to one package failure out of twenty packages (i.e., P=20) an uncorrectable BER is less than 1 bit error in $10^{15}$ bits and a frame error rate is less that 8 frames in $10^{15}$ frames. Not including spare bytes, the coding rate is 0.8315 (i.e., K/N=1031/1240=0.8315). Including two spare bytes per package and twenty packages the coding rate is 0.8055 (i.e., K/(N+S)=1031/(1240+40)=0.8055).

Figure 9:
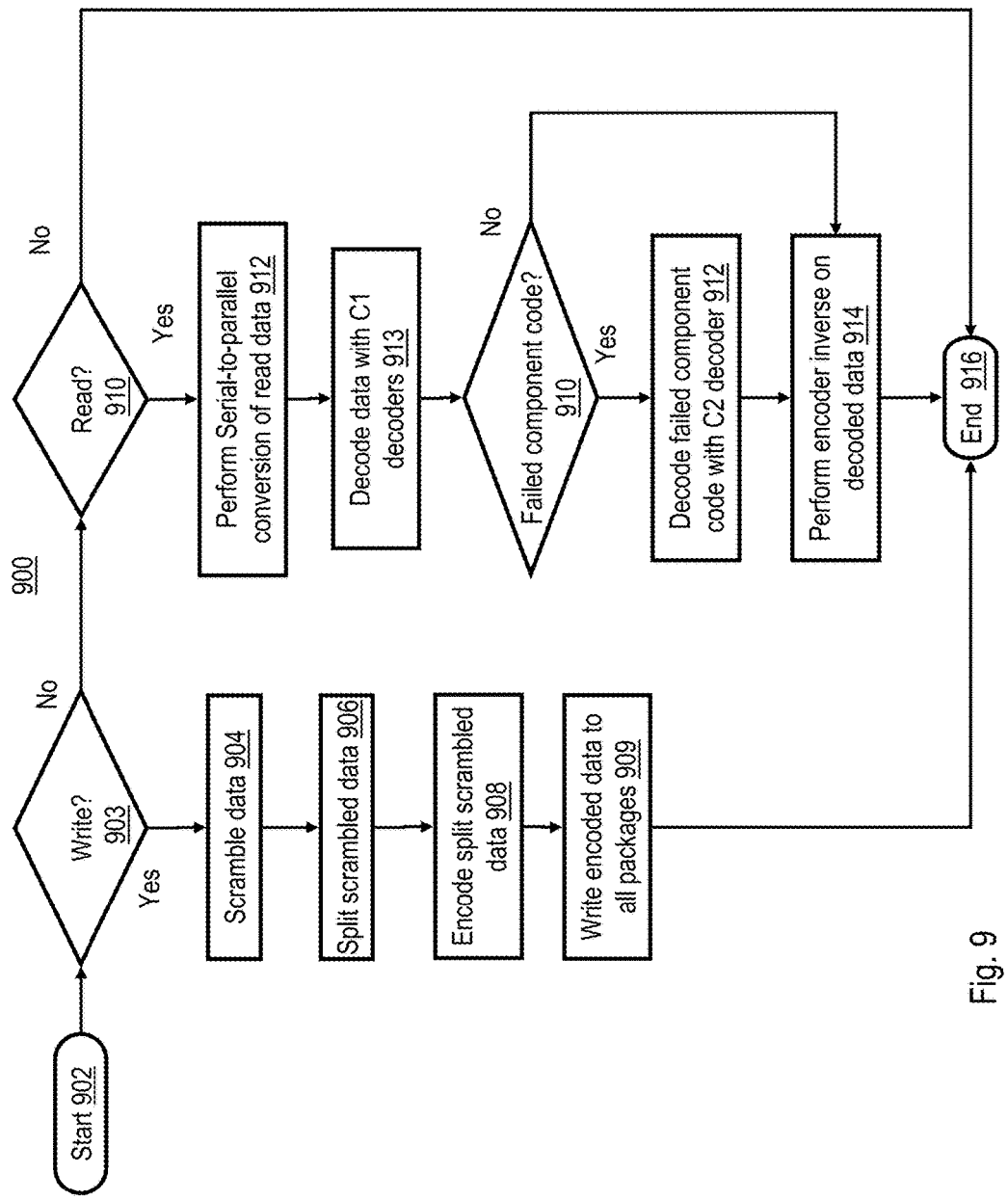
FIG. 9 is a high level logical flowchart of an exemplary data protection process for an NVM in accordance with one embodiment of the present disclosure.

With reference to FIG. 9, an exemplary process 900 is illustrated that handles read/write IOPs directed to an NVM array, according to the present disclosure. Process 900 is initiated in block 902 by, for example, an NVM controller 140, in response to receipt of a request from processor system 102 that is directed at an NVM array in an associated NVM system 150. Next, in decision block 903, NVM controller 140 determines whether the received request is a write IOP. In response to the received request being a write IOP control transfers from block 903 to block 904. In block 904, NVM controller 140 scrambles (see scrambler 204 of FIG. 6) data associated with the write IOP. Then, in block 906, NVM controller 140 splits (see splitter 602 of FIG. 6) the scramble data into 'M' parts based on the implemented C1 and C2 codes. Next, in block 908, NVM controller 140 encodes the split scrambled data using the implemented C1 and C2 encoders and forms M component codewords. Then, in block 909, NVM controller 140 writes the encoded data across all packages in the NVM array (see packages Pkg1-PkgP of FIG. 6) in such a way as to ensure maximum equal spreading of each of the M component codewords across all P packages (see FIG. 5). Following block 909 control transfers to block 916, where process 900 terminates.

In response to the received request not being a write IOP in block 903 control transfers to decision block 910. In block 910 NVM controller 140 determines whether the received request is a read IOP. In response to the received request not being a read IOP control transfers from block 910 to block 916. In response to the received request being a read IOP in block 910 control transfers to block 912. In block 912 NVM controller 140 performs serial-to-parallel (S/P) on read data associated with the read IOP to convert the read data into 'M' parts (see S/P converter 702 of FIG. 7). Next, in block 913, NVM controller 140 decodes the read data with the 'M-1' C1 decoders and the C1 decoder of the C1/C2 decoder. Then, in decision block 910, NVM controller 140 determines whether a single one of the component codewords failed decoding. In response to one of the component codewords failing decoding control transfers to block 912. In block 912, NVM controller 140 decodes the failed component codeword with the C2 decoder. Next, in block 914, NVM controller 140 performs an encoder inverse operation (see encoder inverse module 704 of FIG. 7) on the decoded data (i.e., unscrambles the decoded data). Following block 914 control transfers to block 916. In response to none of the component codewords failing decoding in block 910 control transfers directly to block 914. It should be appreciated that if more than one package in an NVM array fails that an error message may be provided by NVM controller 140 to indicate that the read data is corrupted and cannot be corrected.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a NVM controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transmission media per se, transitory propagating signals per se, and forms of energy per se.

In addition, although embodiments have been described that include use of an NVM such as a phase change memory (PCM), it should be appreciated that embodiments of the present invention can also be used with other types of non-volatile random access memory (NVRAM) including, for example, flash memory, as well as traditional rotational hard drives (HDDs), shingled magnetic recording hard disk drives (SMR HDDs) and combinations thereof.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of protecting data of a data storage system, comprising:
    receiving, by a controller, data for storage in a non-volatile memory (NVM) array of the data storage system;
    in response to receiving the data for storage in the NVM array, forming, by the controller, first component codewords based on encodings with a first level code of respective first portions of the data;
    in response to receiving the data for storage in the NVM array, forming, by the controller, a second component codeword based on an encoding with a second level code of a second portion of the data and the first component codes; and
    storing, by the controller, a respective portion of each of the first and second component codewords on packages of the NVM array, wherein the storing achieves maximum equal spreading of each of the component codewords across all of the packages.

2. The method of claim 1, wherein the first component codewords are formed by respective first encoders and the encoding of the second portion of the data is formed by a second encoder that is different than the first encoders.

3. The method of claim 2, wherein the second component codeword is formed by XORing the first component codewords with the encoding of the second portion of the data.

4. The method of claim 2, wherein the first and second encoders are Reed-Solomon encoders and the second encoder generates a sub-code of a code generated by the first encoders.

5. The method of claim 1, wherein the data is scrambled prior to being encoded.

6. The method of claim 1, wherein a size of the respective portion of each of the first and second component codewords is determined by a ratio of a length of the component codewords to a number of all of the packages.

7. The method of claim 1, wherein the first and second level codes employ low-complexity error-and-erasure decoding algorithms.

8. The method of claim 7, wherein an erasure parameter of the first and second level codes is determined by a ratio of a length of the component codewords to a number of the packages.

9. A data storage system, comprising:
a non-volatile memory (NVM) array; and
a controller coupled to the NVM array, wherein the controller is configured to:
receive data for storage in the NVM array;
in response to receiving the data for storage in the NVM array, form first component codewords based on encodings with a first level code of respective first portions of the data;
in response to receiving the data for storage in the NVM array, form a second component codeword based on an encoding with a second level code of a second portion of the data and the first component codes; and
store a respective portion of each of the first and second component codeswords on packages of the NVM array, wherein the storing achieves maximum equal spreading of each of the component codewords across all of the packages.

10. The data storage system of claim 9, wherein the first component codewords are formed by respective first encoders and the encoding of the second portion of the data is formed by a second encoder that is different than the first encoders.

11. The data storage system of claim 10, wherein the second component codeword is formed by XORing the first component codes with the encoding of the second portion of the data.

12. The data storage system of claim 10, wherein the first and second encoders are Reed-Solomon encoders and the second encoder generates a sub-code of a code generated by the first encoders.

13. The data storage system of claim 9, wherein the data is scrambled prior to being encoded.

14. The data storage system of claim 9, wherein a size of the respective portion of each of the first and second component codewords is determined by a ratio of a length of the component codewords to a number of all of the packages.

15. The data storage system of claim 9, wherein the first and second level codes employ low-complexity error-and-erasure decoding algorithms.

16. The data storage system of claim 15, wherein an erasure parameter of the first and second level codes is determined by a ratio of a length of the component codewords to a number of the packages.

17. A computer program product, the computer program product comprising a computer readable storage medium having program instructions embodied therein, the program instructions executable by a controller, to cause the controller to:
receive data for storage in a non-volatile memory (NVM) array;
in response to receiving the data for storage in the NVM array, form first component codewords based on encodings with a first level code of respective first portions of the data;
in response to receiving the data for storage in the NVM array, form a second component codeword based on an encoding with a second level code of a second portion of the data and the first component codes; and
store a respective portion of each of the first and second component codeswords on packages of the NVM array, wherein the storing achieves maximum equal spreading of each of the component codewords across all of the packages.

18. The program product of claim 17, wherein the first component codewords are formed by respective first encoders and the encoding of the second portion of the data is formed by a second encoder that is different than the first encoders.

19. The program product of claim 18, wherein the second component codeword is formed by XORing the first component codewords with the encoding of the second portion of the data.

20. The program product of claim 18, wherein the first and second encoders are Reed-Solomon encoders and the second encoder generates a sub-code of a code generated by the first encoders, and wherein the first component codewords each encode a same number of bytes of the data, the second component codeword encodes a different number of bytes of the data than the first component codewords, and the first and second level codes are the same.

* * * * *